United States Patent
Erickson

(10) Patent No.: US 12,355,364 B1
(45) Date of Patent: *Jul. 8, 2025

(54) MODULAR PHOTOVOLTAIC STRING INVERTER SYSTEM ADAPTED FOR SIC MOSFETS

(71) Applicant: The Regents of the University of Colorado, a body corporate, Denver, CO (US)

(72) Inventor: Robert W Erickson, Boulder, CO (US)

(73) Assignee: THE REGENTS OF THE UNIVERSITY OF COLORADO, A BODY CORPORATE, Denver, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/073,796

(22) Filed: Oct. 19, 2020

Related U.S. Application Data

(63) Continuation of application No. 16/377,012, filed on Apr. 5, 2019, now Pat. No. 10,812,014.

(60) Provisional application No. 62/653,286, filed on Apr. 5, 2018.

(51) Int. Cl.
*H02M 1/12* (2006.01)
*H02M 7/49* (2007.01)

(52) U.S. Cl.
CPC .............. *H02M 7/49* (2013.01); *H02M 1/123* (2021.05)

(58) Field of Classification Search
CPC ..... G05F 1/67; H02M 2001/123; H02M 7/49; H02M 3/155; H02M 1/123; H02J 3/383; H02S 40/32; H01L 29/1608
See application file for complete search history.

(56) References Cited

U.S. PATENT DOCUMENTS

| | | | | |
|---|---|---|---|---|
| 5,253,157 A | * | 10/1993 | Severinsky | H02J 9/062 363/20 |
| 6,483,730 B2 | * | 11/2002 | Johnson, Jr. | H02M 7/538 363/58 |
| 2010/0172166 A1 | * | 7/2010 | Singh | H02M 7/53871 363/131 |
| 2013/0094260 A1 | * | 4/2013 | Martini | H02M 7/4833 363/97 |
| 2013/0229839 A1 | * | 9/2013 | Escobar | H02M 7/539 363/40 |
| 2013/0229844 A1 | * | 9/2013 | Gazit | H02M 7/44 323/311 |

(Continued)

*Primary Examiner* — Harry R Behm
(74) *Attorney, Agent, or Firm* — FisherBroyles, LLP; Thomas J. Osborne, Jr.

(57) ABSTRACT

In various implementations, string inverter circuit configurations are provided that allow for increased device lifetimes. In one implementation, for example, an inverter includes a pair of inverter input terminals. A ground-balancing converter module is coupled between the pair of inverter input terminals and ground. The ground is disposed between each of the pair of inverter input terminals. A plurality of converter modules is coupled to an output of the ground-balancing converter module, each of the plurality of converter modules providing an output ac phase of the inverter. In another implementation, a method of controlling an inverter is provided. The method includes controlling a voltage level of each terminal of the pair of inverter input terminals to have equal magnitudes and opposite polarities with respect to a ground voltage.

19 Claims, 6 Drawing Sheets

(56) References Cited

U.S. PATENT DOCUMENTS

| | | | | |
|---|---|---|---|---|
| 2014/0376294 A1* | 12/2014 | Hu | ................. | H02M 7/487 |
| | | | | 363/131 |
| 2016/0322916 A1* | 11/2016 | Hao | ................. | H02M 7/483 |
| 2017/0288574 A1* | 10/2017 | Agirman | ................. | H02M 1/32 |
| 2017/0307013 A1* | 10/2017 | Salmia | ................. | F16C 32/0457 |
| 2018/0019688 A1* | 1/2018 | Wang | ................. | H02M 7/797 |

* cited by examiner

GROUND-BALANCING CONVERTER
(GBC) – BASED ON BUCK MODULE

GROUND-BALANCING CONVERTER
(GBC) – BASED ON DC
TRANSFORMER (DCX) BUCK
MODULE

MODULAR PHOTOVOLTAIC STRING INVERTER SYSTEM ADAPTED FOR SiC MOSFETS

CROSS-REFERENCE TO RELATED APPLICATIONS

This application is a continuation of U.S. application Ser. No. 16/377,012 filed on Apr. 5, 2019, which claims the benefit of U.S. provisional application No. 62/653,286, filed Apr. 5, 2018, each application of which is hereby incorporated by reference as though fully set forth herein.

BACKGROUND a. Field

The present disclosure relates to string inverters for solar photovoltaic power systems.

b. Background

Photovoltaic system inverters typically exhibit significantly shorter lifetimes and higher operation and maintenance costs than the remainder of the photovoltaic system, such as five to ten years vs. twenty to thirty years. Of particular concern is the reliability of mechanical cooling fans and of power converter capacitors. Additionally, operating temperatures significantly impact mean time to failure (MTTF).

BRIEF SUMMARY

In various implementations, string inverter circuit configurations are provided that allow for increased device lifetimes. In one implementation, for example, transistors in the inverter experience peak voltages lower than a voltage applied to input terminals of the inverter circuit.

In one implementation, for example, an inverter includes a pair of inverter input terminals. A ground-balancing converter module is coupled between the pair of inverter input terminals and ground. The ground is disposed between each of the pair of inverter input terminals. A plurality of converter modules is coupled to an output of the ground-balancing converter module, each of the plurality of converter modules providing an output ac phase of the inverter.

In another implementation, method of controlling an inverter is provided. The inverter includes a pair of inverter input terminals and a ground-balancing converter module coupled between the pair of inverter input terminals and ground. The ground is disposed between each of the pair of inverter input terminals. A plurality of converter modules is coupled to an output of the ground-balancing converter module. Each of the plurality of converter modules provides an output ac phase of the inverter. The method comprises controlling a voltage level of each terminal of the pair of inverter input terminals to have equal magnitudes and opposite polarities with respect to a ground voltage.

The foregoing and other aspects, features, details, utilities, and advantages of the present invention will be apparent from reading the following description and claims, and from reviewing the accompanying drawings.

DETAILED DESCRIPTION

In various implementations, string inverter circuit configurations are provided that allow for increased device lifetimes. Implementations provided include a string inverter for solar photovoltaic power systems that utilizes silicon carbide (SiC) power MOSFET devices. These devices are now available with ratings of 650 V, 900 V, 1200 V, 1700 V, and higher voltages up to 10,000 V, and exhibit very low on resistance and very fast switching times relative to conventional silicon power transistors. Generally, SiC devices with lower voltage ratings exhibit the lowest cost per rated transistor kVA, as well as the lowest on-resistance and the lowest switching loss. In some implementations, for example, modular converter architectures are provided that may optimized or otherwise improve performance by taking advantage of characteristics of these devices in a photovoltaic string inverter application, such that significantly lower loss and higher reliability is achieved. Converter architectures are provided that are adapted for SiC MOSFET technology, and that achieve major improvements in loss, reliability, and power density.

In one implementation, a string inverter is provided for utility-scale or commercial-scale (e.g., 1500 Vdc) photovoltaic systems, interfaced through inverters to a 600 Vac three-phase utility grid. The string inverters typically operate with dc input voltages (from the series-connected strings of PV panels) of 600 V to 1500 V dc. The inverter three-phase output voltage typically is 600 V rms line-to-line, +/−20%. In example implementations, string inverters may be provided, such as but not limited to 50 kW, 60 kW, 100 KW, 120 KW, 240 KW, 480 kW or several hundred kW, having size and weight such that one or two people can manually install these inverters without need for a crane or other mechanical assistance. These implementations can provide relatively very high power density and extremely low loss.

Figure 8:
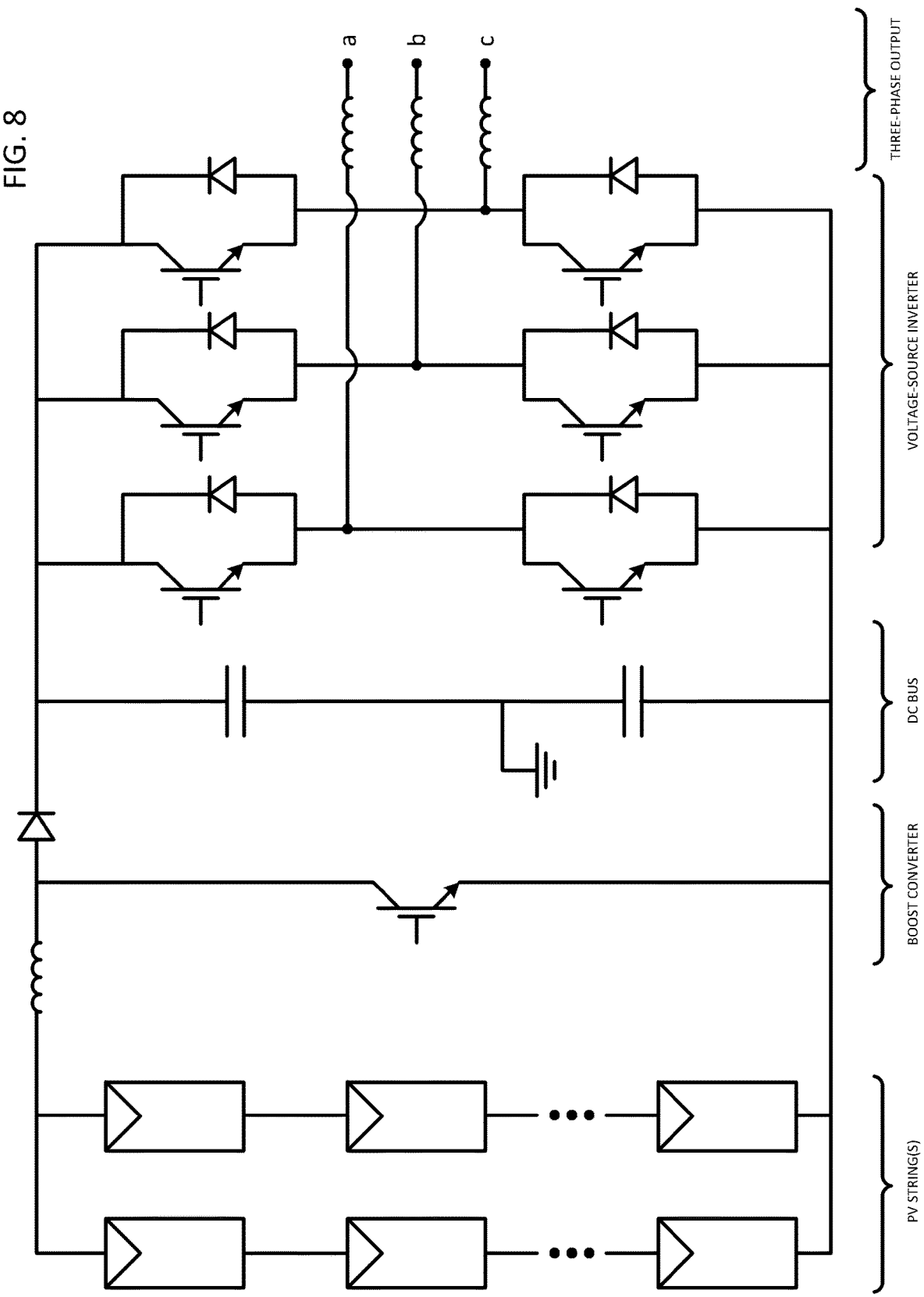
FIG. 8 shows a schematic of the power stage elements of a typical realization of such a system.

A typical string inverter has an input voltage Vpv range of 600 V to 1500 V supplied by photovoltaic strings. It has a three-phase ac output that is nominally 600 V rms line-line. A schematic of the power stage elements of a typical realization of such a system is illustrated in FIG. 8. One or more series-connected strings of photovoltaic (PV) panels supply dc power to the input of the inverter system. A boost dc-dc converter interfaces the dc input to an intermediate dc bus. This dc bus is connected through a voltage-source inverter circuit to the three-phase ac utility. The dc bus voltage must be greater than or equal to the peak line-line voltage of the three-phase output; for a 600 V three-phase output, a dc bus of approximately 1000 V or greater is required. When the PV strings produce less than this amount, the boost converter operates to boost the PV string voltage to the required dc bus voltage. FIG. 8 illustrates the use of silicon diodes and silicon insulated gate bipolar transistors (IGBT) as the switching elements of the current state of the art. In the realization illustrated in FIG. 8, the dc bus voltage must also be greater than or equal to the PV input voltage Vpv; if the maximum PV input voltage is 1500 V, then the dc bus voltage must also withstand 1500 V. The IGBT and diode devices must be rated to withstand this 1500 V, with an appropriate safety margin.

Figure 1:
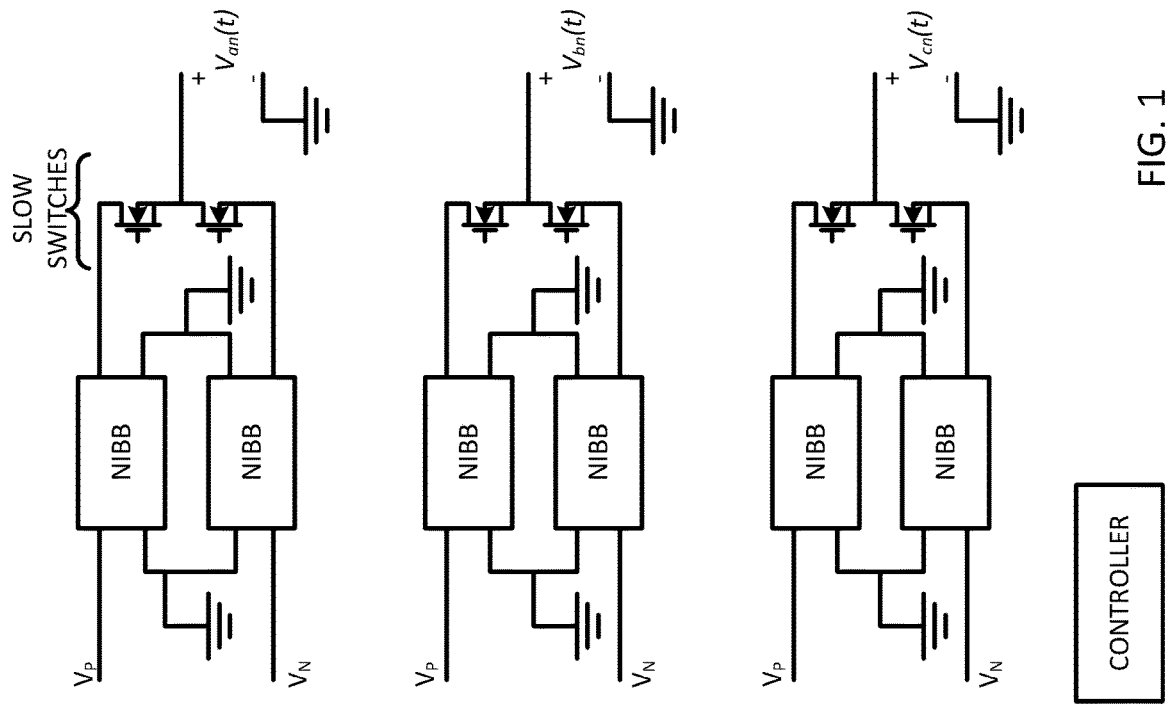
FIG. 1 illustrates a basic modular structure of an example inverter circuit.
Figure 1:
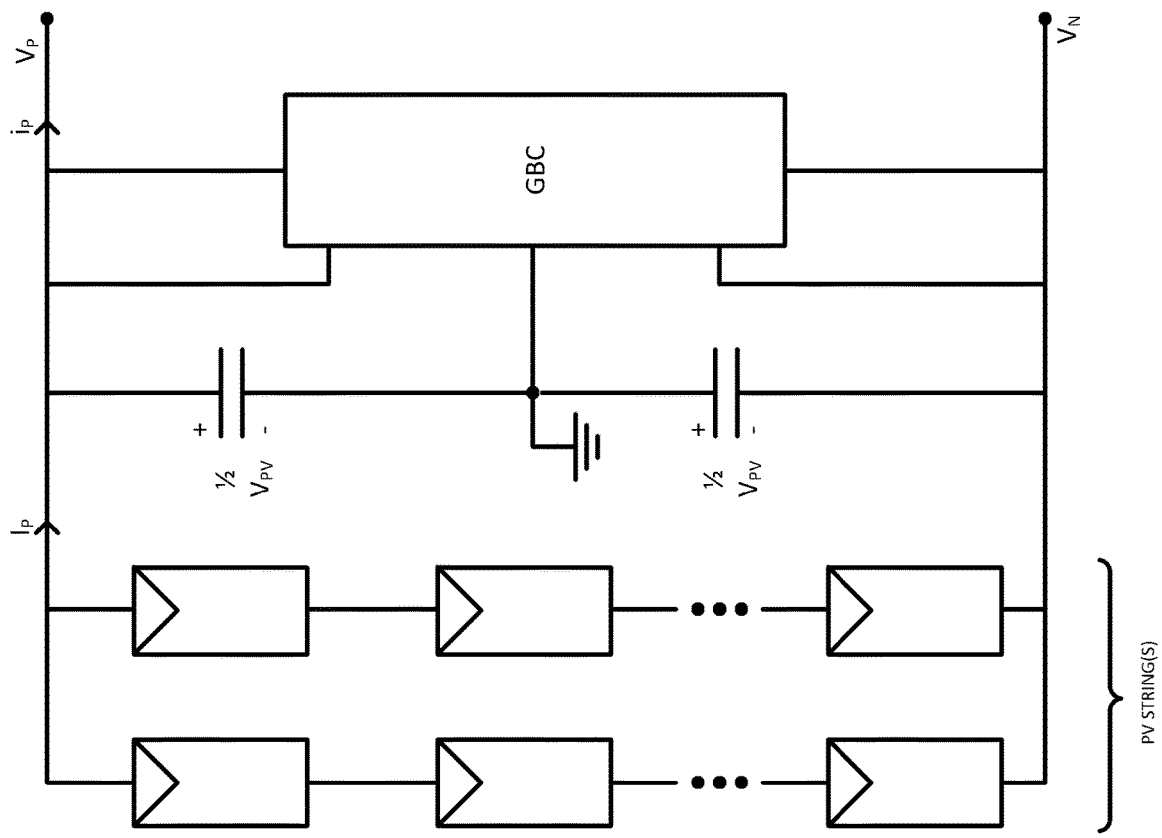

In various implementations, inverter circuits using SiC power transistors that exhibit extremely low worst-case power loss, small inverter size and weight, and long mean time to failure, are provided. An example design achieves 500 W of loss at 120 kW output power. FIG. 1 illustrates a basic modular structure of an example inverter circuit. The inverter input, in this implementation, comprises one or more series-connected strings of photovoltaic panels, connected between an inverter input positive terminal Vp and an inverter input negative terminal Vn. A ground-balancing converter module (GBC) is connected between these input terminals and earth ground, and is controlled such that the voltages Vp and Vn have equal magnitudes and opposite polarities with respect to the earth ground voltage. The terminals Vp, Vn, and earth ground provide the inputs to the modular converters that supply each phase of the inverter three-phase ac output. Each output ac phase is driven by two noninverting buck-boost (NIBB) converter modules, which provide the positive and negative portions of the ac output line-neutral phase voltages. Transistor switches ("slow switches" that are controlled to switch at the ac line frequency) alternately connect the positive-side or negative-side NIBB outputs to the ac phase, to assemble the output sinusoidal waveform.

A controller adjusts the conduction states of the module power transistors such that a desired conversion function is achieved. In a grid-tied application, the controller operates the PV string input to achieve maximum power production of the PV panels, and also to control the converter system such that desired three-phase ac current waveforms are produced at the converter output terminals. Control algorithms that achieve these goals are known in the art and are not discussed here, except to the extent that control is provided for the string inverters provided herein.

Figure 6:
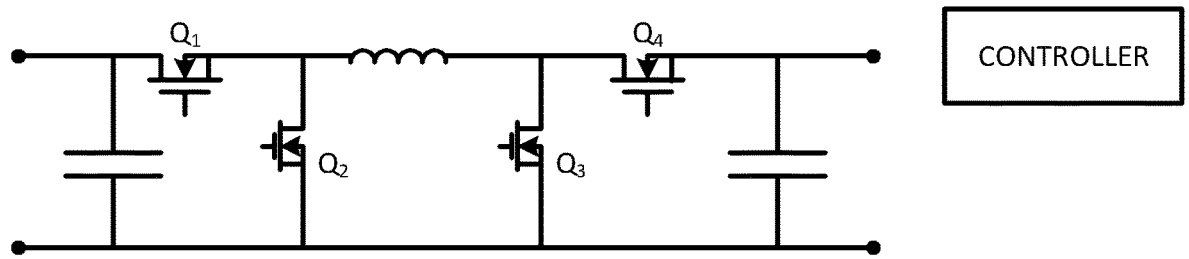
FIG. 6 illustrates an example implementation of a non-inverting buck-boost converter.

FIG. 6 illustrates a basic realization of a noninverting buck-boost converter. This module comprises buck switches Q1 and Q2, a shared inductor L, and boost switches Q3 and Q4. Its dc output voltage can be greater or less than its dc input voltage. When reducing the voltage, the buck switches Q1 and Q2 operate with pulse-width modulation, while the boost switches operate in pass-through mode with Q3 in the off state and Q4 in the on state. When increasing the voltage, the buck switches operate in pass-through mode with Q1 in the on state and Q2 in the off state, which the boost switches Q3 and Q4 operate with pulse-width modulation to control the output voltage.

The buck transistors Q1 and Q2 operate as "synchronous switches." In this implementation, the controller does not command both transistors to conduct simultaneously. Rather, the gate drive of transistor Q2 is the logical complement of the gate drive of transistor Q1, so that Q2 conducts when Q1 is off, and vice-versa. A short "dead time" can be inserted between the turn-off transition of one transistor and the turn-on transition of the other transistor, to ensure that both devices do not simultaneously conduct. The fraction of time that Q1 conducts is known as the "duty cycle". A controller can vary the ratio of input voltage to output voltage of a converter module through variation of this duty cycle. The boost transistors Q3 and Q4 also operate as synchronous switches, in a similar manner.

In FIG. 1 and subsequent figures, the switches are represented as MOSFETS. These devices include body diodes, and the MOSFET devices are capable of bidirectional current flow. In various implementations, these MOSFETs are realized using Silicon Carbide (SiC) devices. Gate driver and controller circuitry switch these devices between the on (conducting) and off (non-conducting) states as necessary to achieve the desired functionality. Gate drivers intended to drive MOSFETs are commercially available, and the control functionality may be provided using a commercially-available microcontroller.

Figure 2:
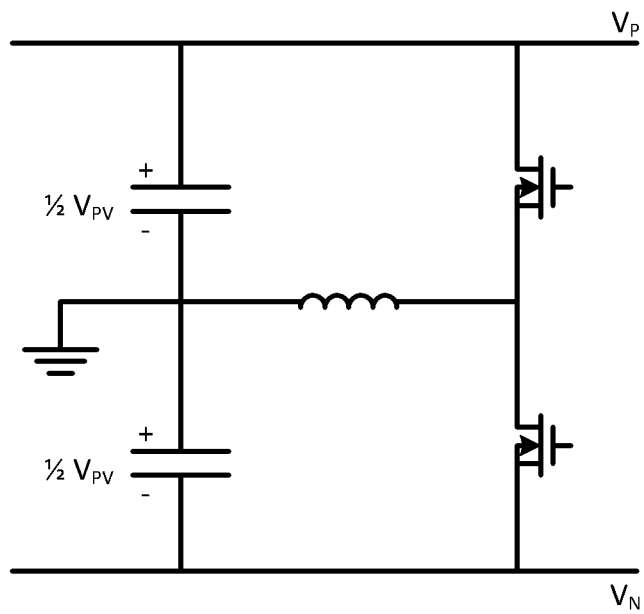
FIG. 2 illustrates an example implementation of a ground-balancing converter module.
Figure 3:
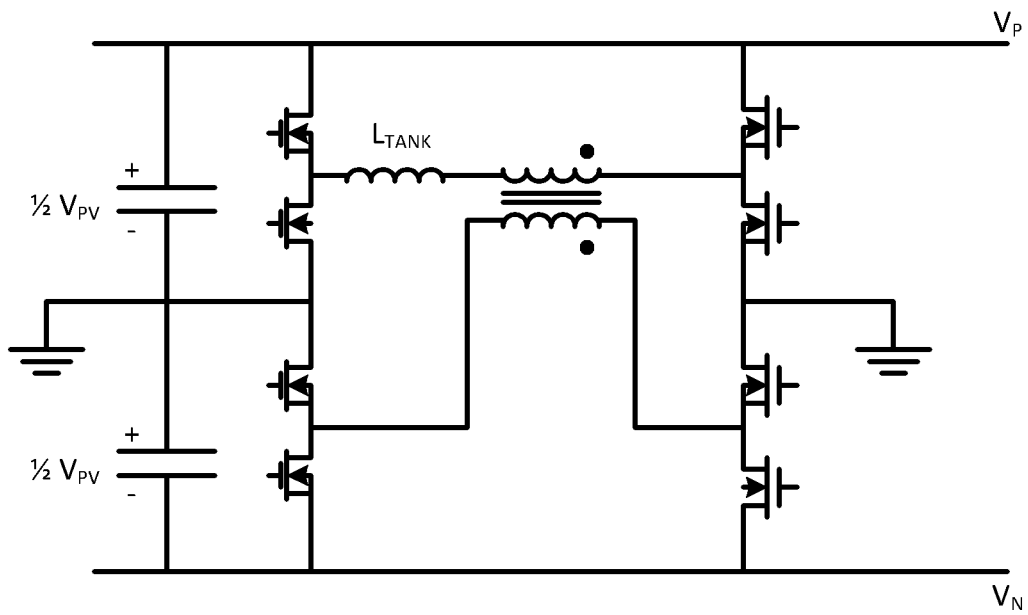
FIG. 3 illustrates another example implementation of a ground-balancing converter module.
Figure 4:
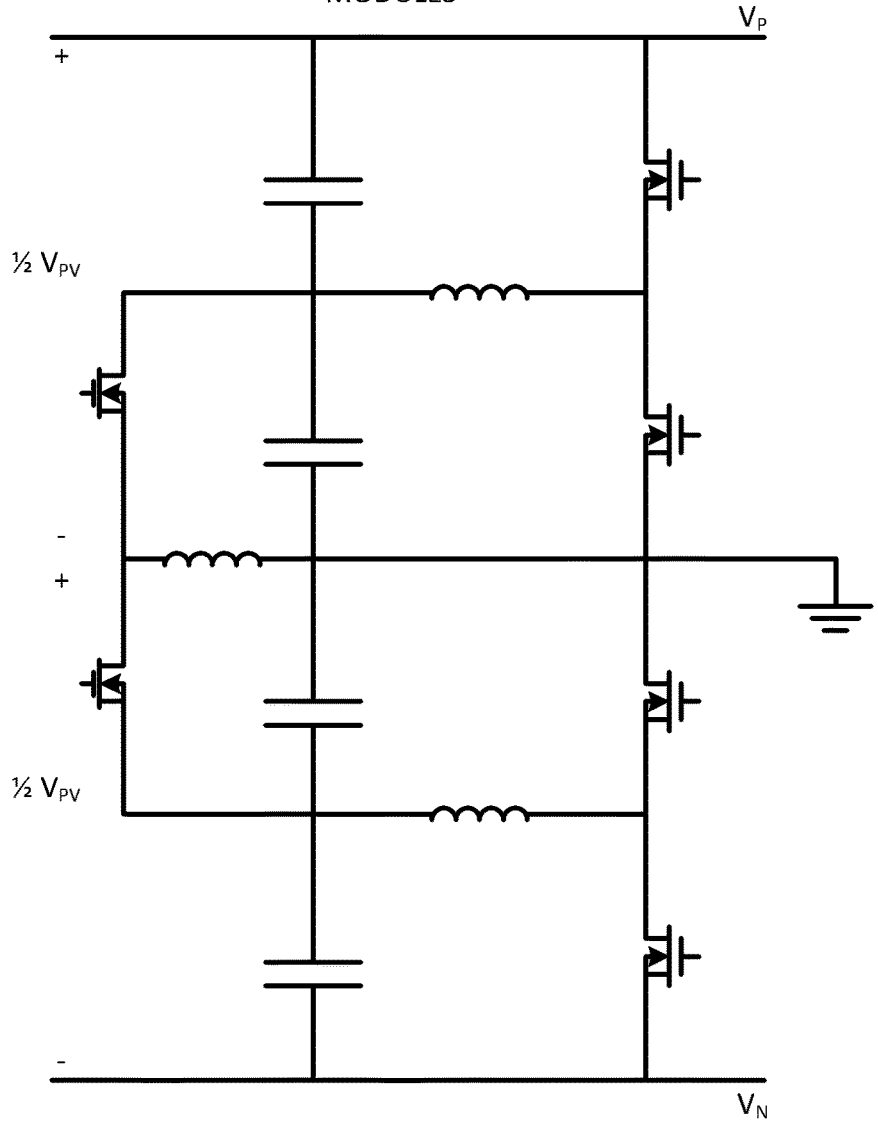
FIG. 4 illustrates yet another example implementation of a ground-balancing converter module.

FIGS. 2, 3, and 4 illustrate options for realization of the ground-balancing converter module. FIG. 2 illustrates use of a bidirectional buck converter to perform this function. When the switches operate with a duty cycle of 0.5, then the earth ground potential will be positioned halfway between Vp and Vn. With respect to earth ground, Vp=0.5 Vpv and Vn=−0.5 Vpv. In the configuration shown in FIG. 2, for example, each MOSFET should be able to withstand voltage Vpv.

FIG. 3 shows another implementation of a ground-balancing converter, comprising a dc transformer circuit (DCX). In this implementation, the circuit employs a transformer having a 1:1 turns ratio. It maintains approximately equal dc input and output voltages, so that Vp=−Vn=0.5 Vpv. In this example, each MOSFET should be able to withstand voltage 0.5 Vpv. A number of variant DCX circuits are known in the literature.

FIG. 4 illustrates another example implementation of a ground-balancing converter (GBC) module. In this example, input filter capacitors are further split into quarters, so that each capacitor supports a voltage of 0.25 Vpv. This circuit is similar to the one shown in FIG. 2, but includes a total of three buck converter modules. If all three converters operate with duty cycle of 0.5, for example, then in steady state the total voltage Vpv is divided evenly between the four capacitors.

As is evident from the system requirements, this inverter should be capable of both increasing (boosting), and reducing (bucking) the input voltage, to produce the instantaneous ac output voltage. The modules of FIG. 1 labeled NIBB function as noninverting buck-boost (NIBB) dc-dc converter modules that accomplish this function, while minimizing/reducing loss, minimizing/reducing inductor size, minimizing/reducing rms capacitor currents, and/or minimizing/reducing cost of the SiC MOSFETs. Switching converter circuits that employ lower-voltage MOSFETs, where voltage stress is shared between multiple series-connected devices, generally achieve reduced loss and reduced overall cost of semiconductor devices. The modular structure of the implementation shown in FIG. 1 addresses these goals.

The inverter system includes noninverting buck-boost (NIBB) converter modules that supply the positive and negative portions of an output ac sinusoid. For each output phase, a positive-side NIBB operates with pulse-width modulation when the ac output phase voltage is positive with respect to earth ground. When the ac output phase voltage is negative, the positive side of the noninverting buck-boost converter produces an output voltage of zero. The negative-side noninverting buck-boost converter module operates in a similar manner, providing a pulse-width modulated output for the negative portion of the output sinusoid and providing a zero output when the output phase voltage is positive.

Figure 7:
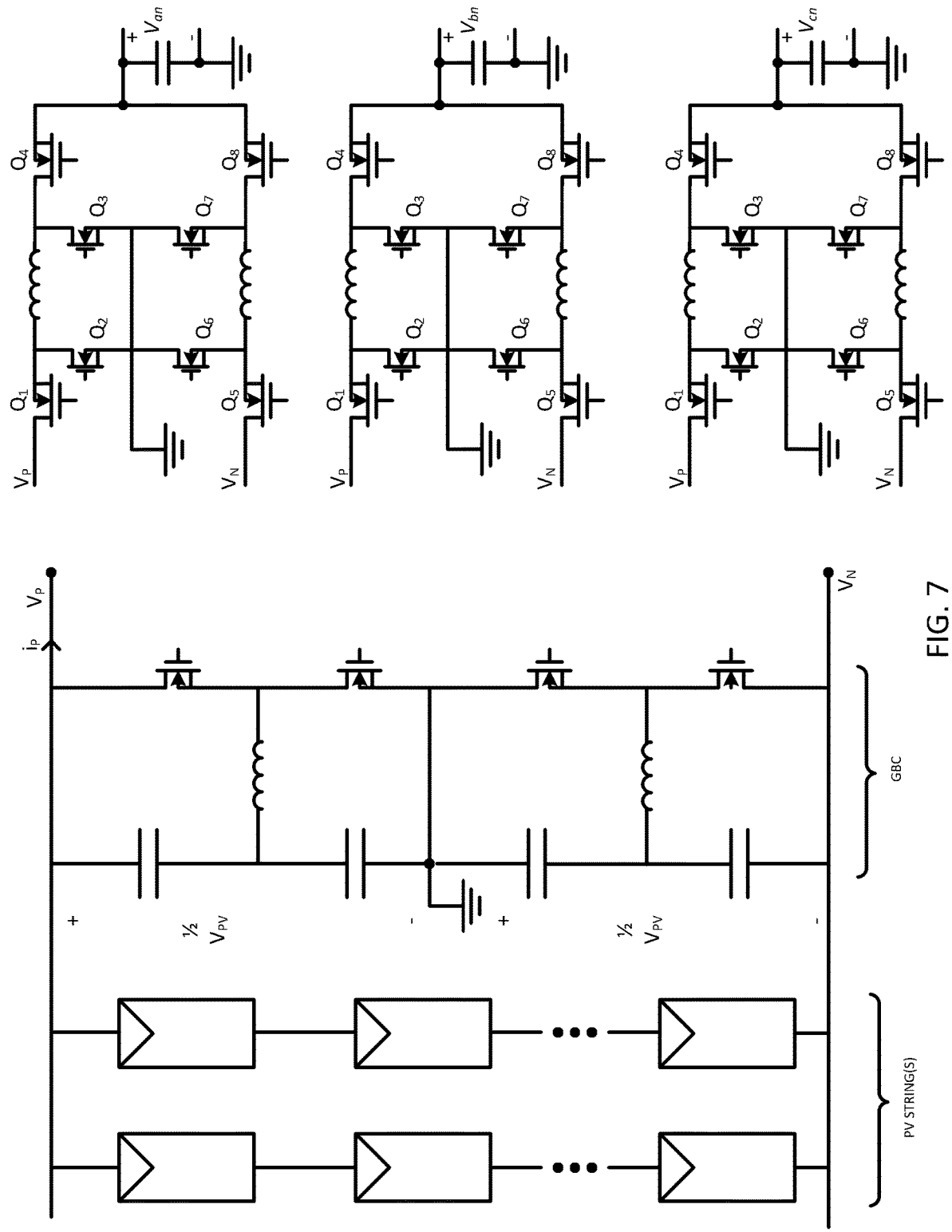
FIG. 7 illustrates another example implementation of a string inverter circuit.

FIG. 7 illustrates another implementation of a string inverter circuit, such as that shown in FIG. 1. In this particular implementation, for example, ac output-side slow switches are combined with output switches of the noninverting buck-boost converters, leading to a single output-side switch having a single on-resistance and hence reduced conduction loss. The noninverting buck-boost converter output filter capacitor, in this implementation, is moved to the ac output side of the inverter. The remaining output switch is operated with pulse-width modulation, and in some implementations is a silicon-carbide MOSFET or other wide bandgap device. This manipulation leads to reduced conduction loss and reduced cost of the SiC MOSFETs. This improvement is possible because the negative-side NIBB modules produce zero output voltage while the positive-side NIBB modules are operating, and vice-versa. When a NIBB module produces zero output, its output transistor (for example, Q4 or Q8 in FIG. 7) can simply be turned off, so that the opposite NIBB module drives the output.

Figure 5:
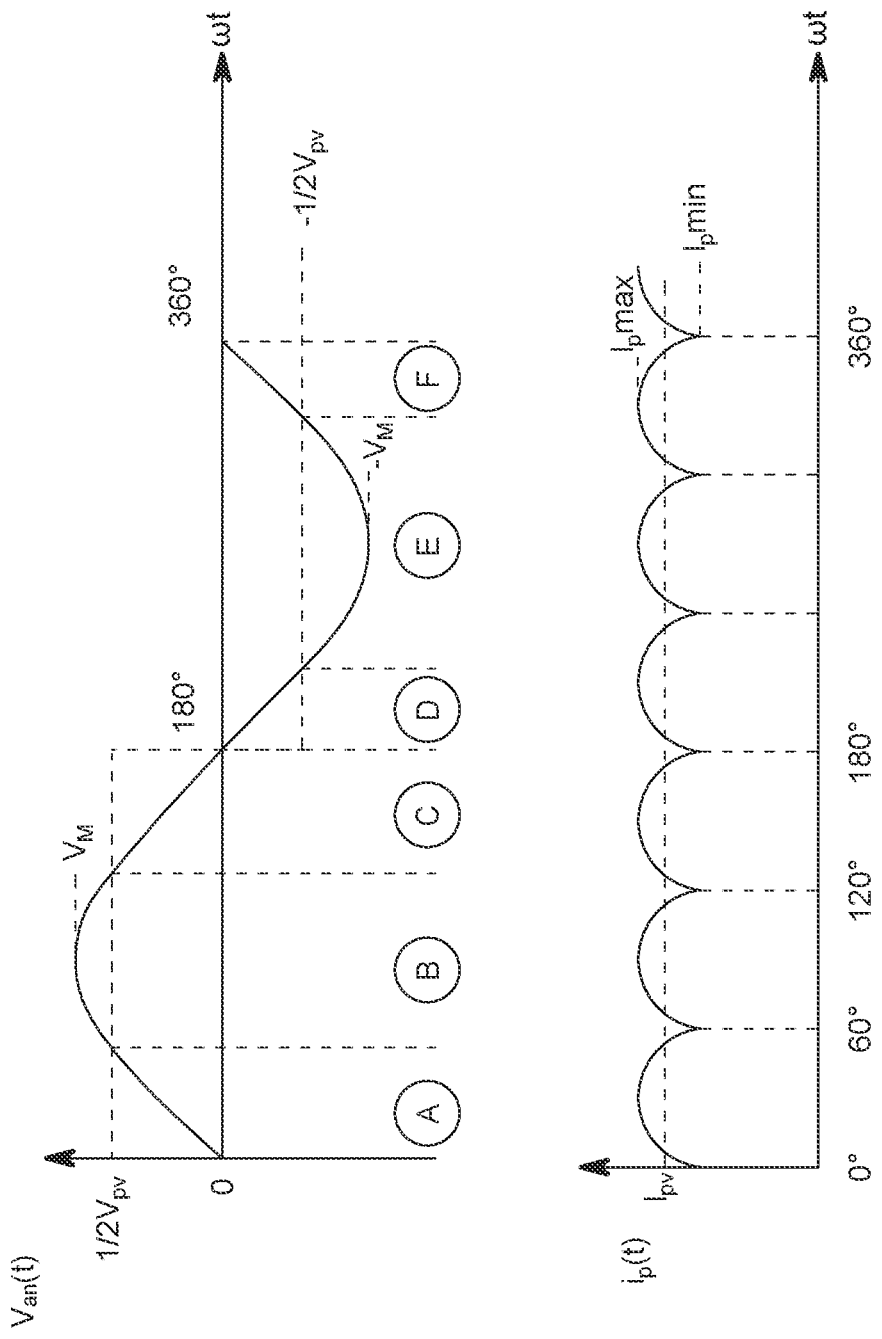
FIG. 5 illustrates the ac output phase voltage $V_{an}$ (t) and the current $i_p$ (t) of one example implementation, as identified in FIG. 7, over one complete cycle of a phase a output sinusoid $V_{an}$ (t); and further illustrates example time intervals A to F, which can be used to define control modes of an example modular inverter system.

FIG. 5 illustrates the ac output phase voltage $V_{an}$ (t) and the current $i_p$ (t), as identified in FIG. 7, over one complete cycle of the phase a output sinusoid $V_{an}$ (t). Also identified in FIG. 5 are time intervals A to F, which define the control modes of the modular inverter system. In one implementation, for example, the inverter system modules can be controlled as follows.

Interval A of FIG. 5 occurs for $0<V_{an}<0.5\ V_{pv}$. During this interval, the positive-side NIBB operates in buck mode, to reduce its input voltage $0.5\ V_{pv}$ to the desired output voltage $V_{an}$. The controller adjusts the Q1/Q2 duty cycles as necessary to achieve this voltage ratio and further to achieve the desired ac output current waveform. During this interval, the boost switches operate in passthrough mode: Q3 is off and Q4 is on. Additionally, the negative-side NIBB module operates in the off state: Q5 is off, Q6 is on, Q7 is on, and Q8 is off.

Interval B of FIG. 5 occurs for $0.5\ V_{pv}<V_{an}$. During this interval, the positive-side NIBB operates in boost mode, to increase its input voltage $0.5\ V_{pv}$ to the desired output voltage $V_{an}$. The controller adjusts the Q3/Q4 duty cycles as necessary to achieve this voltage ratio and further to achieve the desired ac output current waveform. During this interval, the buck switches operate in passthrough mode: Q1 is on and Q2 is off. Additionally, the negative-side NIBB module operates in the off state: Q5 is off, Q6 is on, Q7 is on, and Q8 is off.

Interval C of FIG. 5 is similar to interval A, with the same switch operation.

Interval D of FIG. 5 occurs for $-0.5\ V_{pv}<V_{an}<0$. During this interval, the negative-side NIBB operates in buck mode, to reduce its input voltage magnitude $0.5\ V_{pv}$ to the desired output voltage magnitude $V_{an}$. Referring to FIG. 7, the controller adjusts the Q5/Q6 duty cycles as necessary to achieve this voltage ratio and further to achieve the desired ac output current waveform. During this interval, the boost switches operate in passthrough mode: Q7 is off and Q8 is on. Additionally, the positive-side NIBB module operates in the off state: Q1 is off, Q2 is on, Q3 is on, and Q4 is off.

Interval E of FIG. 5 occurs for $v_{an}<-0.5\ V_{pv}$. During this interval, the negative-side NIBB operates in boost mode, to increase its input voltage magnitude $0.5\ V_{pv}$ to the desired output voltage magnitude $V_{an}$. Referring to FIG. 7, the controller adjusts the Q7/Q8 duty cycles as necessary to achieve this voltage ratio and further to achieve the desired ac output current waveform. During this interval, the buck switches operate in passthrough mode: Q5 is off and Q6 is on. Additionally, the positive-side NIBB module operates in the off state: Q1 is off, Q2 is on, Q3 is on, and Q4 is off.

Interval F of FIG. 5 is similar to interval D, with the same switch operation.

Since the silicon carbide MOSFETs are capable of conducting positive and negative current, the modules and inverter system are capable of supplying non-unity-power-factor loads. For example, the inverter output current of a given phase can be negative when its output voltage is positive, and vice-versa.

As noted earlier, the transistors in the implementations provided herein experience peak voltages that are lower than the applied terminal voltages. This is advantageous because lower voltage SiC MOSFETs have lower cost and exhibit lower conduction and switching losses. For the example application discussed above, with a maximum $V_{pv}$ of 1500 V and a three-phase output of 600 V (line-line, rms), the NIBB buck switches can be rated 1200 V and the NIBB boost switches can be rated 900 V. These ratings allow for voltage deratings of ⅔ or better.

Although implementations have been described above with a certain degree of particularity, those skilled in the art could make numerous alterations to the disclosed embodiments without departing from the spirit or scope of this invention. All directional references (e.g., upper, lower, upward, downward, left, right, leftward, rightward, top, bottom, above, below, vertical, horizontal, clockwise, and counterclockwise) are only used for identification purposes to aid the reader's understanding of the present invention, and do not create limitations, particularly as to the position, orientation, or use of the invention. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other. It is intended that all matter contained in the above description or shown in the accompanying drawings shall be interpreted as illustrative only and not limiting. Changes in detail or structure may be made without departing from the spirit of the invention as defined in the appended claims.

What is claimed is:

1. An inverter comprising:
   a pair of inverter input terminals;
   a ground-balancing converter module comprising a pair of ground-balancing converter module input terminals coupled between the pair of inverter input terminals and ground and a pair of ground-balancing converter module output terminals, wherein the ground is disposed between each of the pair of inverter input terminals, the ground-balancing converter module comprises a first output terminal and a second output terminal; and
   a plurality of converter modules coupled to the first output terminal and the second output terminal of the ground-balancing converter module, each of the plurality of converter modules providing an output ac phase of the inverter, and
   a controller adapted to control the ground-balancing converter module such that the first output terminal and second output terminal have equal magnitudes and opposite polarities with respect to a ground voltage,
   wherein at least one of the plurality of converter modules comprises a positive side module and a negative side module, the positive side module and the negative side module respectively supply a positive portion and a negative portion of an output ac sinusoid of the output ac phase of the at least one of the plurality of converter modules.

2. The inverter of claim 1, wherein the pair of inverter input terminals is adapted to be coupled to one or more strings of series-connected photovoltaic cells.

3. The inverter of claim 1 wherein a voltage level of each terminal of the pair of inverter input terminals is controlled via a controller to have equal magnitudes and opposite polarities with respect to the ground voltage.

4. The inverter of claim 1 wherein the ground-balancing converter module is based upon a buck module.

5. The inverter of claim 1 wherein the ground-balancing converter module is based upon a DC transformer module.

6. The inverter of claim 1 wherein the ground-balancing converter module is based upon dual buck modules.

7. The inverter of claim 1 wherein the ground-balancing converter module comprises at least one silicon carbide MOSFET.

8. The inverter of claim 1 wherein each of the plurality of converter modules comprises at least one silicon carbide MOSFET.

9. The inverter of claim 1 wherein the controller adjusts a conduction state of module power transition to control a conversion function.

10. The inverter of claim 9 wherein the controller controls the inverter to achieve maximum power production of at least one string of series-connected photovoltaic cells.

11. The inverter of claim 1 wherein each of the plurality of converter modules comprises a pair of noninverting converter modules.

12. The inverter of claim 1 wherein the plurality of converter modules comprise three converter modules adapted to supply each phase of an inverter three-phase ac output.

13. The inverter of claim 12 wherein each of the plurality of converter modules comprises a pair of noninverting converter modules that provide positive and negative portions of an ac output line-neutral phase voltages.

14. The inverter of claim 13 wherein the plurality of converter modules each comprise transistor switches controlled to switch at an ac line frequency.

15. The inverter of claim 14 wherein the transistor switches alternately connect a positive-side and negative-side noninverting converter module outputs to the output ac phase.

16. The inverter of claim 1 wherein one or more transistors in the ground-balancing converter module experience peak voltages lower than a voltage applied to the pair of inverter input terminals.

17. A method of controlling an inverter comprising:
providing an inverter comprising:
a pair of inverter input terminals,
a ground-balancing converter module comprising a pair of ground-balancing converter module input terminals coupled between the pair of inverter input terminals and ground, wherein the ground is disposed between each of the pair of inverter input terminals, the ground-balancing converter module comprises a first output terminal and a second output terminal, and
a plurality of converter modules coupled to an output of the ground-balancing converter module, each of the plurality of converter modules providing an output ac phase of the inverter; and
controlling the ground-balancing converter module such that the first output terminal and second output terminal have equal magnitudes and opposite polarities with respect to a ground voltage,
wherein at least one of the plurality of converter modules comprises a positive side module and a negative side module, the positive side module and the negative side module respectively supply a positive portion and a negative portion of an output ac sinusoid of the output ac phase of the at least one of the plurality of converter modules.

18. The method of claim 17 wherein the ground-balancing converter module comprises at least one silicon carbide MOSFET.

19. The method of claim 17 wherein each of the plurality of converter modules comprises at least one silicon carbide MOSFET.

* * * * *